United States Patent
Hidaka

(10) Patent No.: US 9,655,231 B2
(45) Date of Patent: May 16, 2017

(54) COMPENSATING FOR INTRA-PAIR SKEW IN DIFFERENTIAL SIGNALING

(71) Applicant: FUJITSU LIMITED, Kawasaki-shi, Kanagawa (JP)

(72) Inventor: Yasuo Hidaka, Cupertino, CA (US)

(73) Assignee: FUJITSU LIMITED, Kawasaki (JP)

( * ) Notice: Subject to any disclaimer, the term of this patent is extended or adjusted under 35 U.S.C. 154(b) by 16 days.

(21) Appl. No.: 14/275,604

(22) Filed: May 12, 2014

(65) Prior Publication Data
US 2015/0327358 A1  Nov. 12, 2015

(51) Int. Cl.
| H05K 1/00 | (2006.01) |
| H05K 1/02 | (2006.01) |
| H05K 1/03 | (2006.01) |
| H05K 3/00 | (2006.01) |

(52) U.S. Cl.
CPC ........... *H05K 1/024* (2013.01); *H05K 1/0248* (2013.01); *H05K 1/038* (2013.01); *H05K 1/0313* (2013.01); *H05K 1/0366* (2013.01); *H05K 3/0091* (2013.01); *H05K 2201/07* (2013.01); *H05K 2203/0195* (2013.01)

(58) Field of Classification Search
CPC ....... H05K 1/03; H05K 1/0306; H05K 1/0313
USPC ........................................ 174/255, 256, 258
See application file for complete search history.

(56) References Cited

U.S. PATENT DOCUMENTS

| 7,022,919 | B2 | 4/2006 | Brist et al. |
| 7,043,706 | B2 | 5/2006 | Brist et al. |
| 7,343,576 | B2 | 3/2008 | Brist et al. |
| 7,427,719 | B2 | 9/2008 | Liang et al. |
| 7,723,618 | B2 | 5/2010 | Liang et al. |
| 8,168,891 | B1 * | 5/2012 | Goergen ................. H01P 3/081 174/255 |
| 8,319,113 | B2 * | 11/2012 | Cases ..................... H05K 1/024 174/255 |
| 2008/0297978 | A1 * | 12/2008 | Ohaga .................... H01G 4/105 361/321.4 |

(Continued)

OTHER PUBLICATIONS

Gary Bit, Bryce Horine and Gary Long, "Woven Glass Reinforcement Patterns," in Printed Circuit Design & Manufacture, pp. 28-33, Nov. 2004.

(Continued)

*Primary Examiner* — Chau N Nguyen
(74) *Attorney, Agent, or Firm* — Maschoff Brennan

(57) ABSTRACT

A circuit may be configured to reduce electrical signal degradation. The circuit may include a first trace and a second trace that may be broadside coupled between a first ground plane and a second ground plane. The first and second traces may be configured to carry first and second signals, respectively, of a differential signal. The circuit may also include a first dielectric material disposed between the first trace and the second trace. Further, the circuit may include a second dielectric material disposed between the first trace and the first ground plane and disposed between the second trace and the second ground plane. A difference between a first dielectric constant of the first dielectric material and a second dielectric constant of the second dielectric material may suppress a mode conversion of the differential signal from a differential mode to a common mode.

16 Claims, 6 Drawing Sheets

(56) References Cited

U.S. PATENT DOCUMENTS

2009/0242259 A1* 10/2009 Ho .................... H05K 1/0218
                                                    174/261
2009/0297978 A1* 12/2009 Kawamura ........... B41C 1/1008
                                                    430/270.1
2014/0066283 A1* 3/2014 Kaneko ................ H05K 1/0306
                                                    501/9

OTHER PUBLICATIONS

Altera Corporation, "PCB Dielectric Material Selection and Fiber Weave Effect on High-Speed Channel Routing," Altera Application Note AN-528-1.1, Jan. 2011.
Scott McMorrow, Chris Heard, "The Impact of PCB Laminate Weave on the Electrical Performance of Differential Signaling at Multi-Gigabit Data Rates," DesignCon 2005.
John Kuhn, "Advanced Reinforcement Technology Presents New Design Opportunities for Printed Circuit Boards," ECWC 10 Conference at IPC Printed Circuit Expo, SMEMA Council APEX and Designers Summit May 2005.
Seymour B. Cohn, "Characteristic Impedances of Broadside-Coupled Strip Transmission Lines," IRE Transactions on Microwave Theory and Techniques, pp. 633-637, Nov. 1960.

* cited by examiner

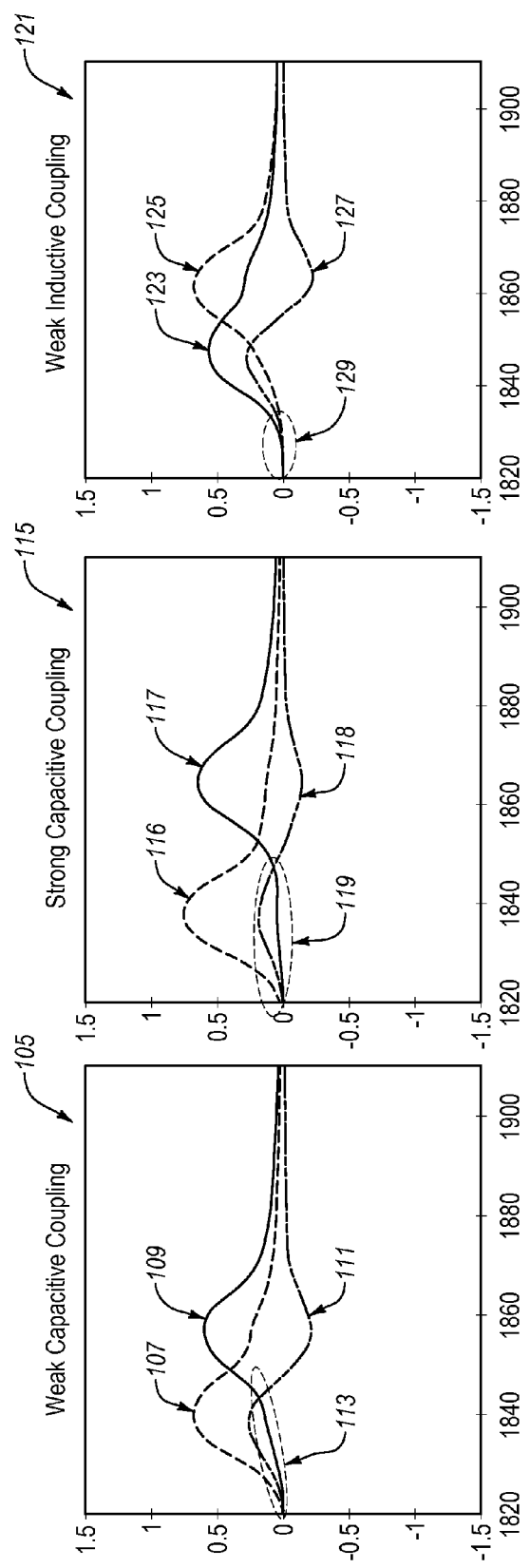

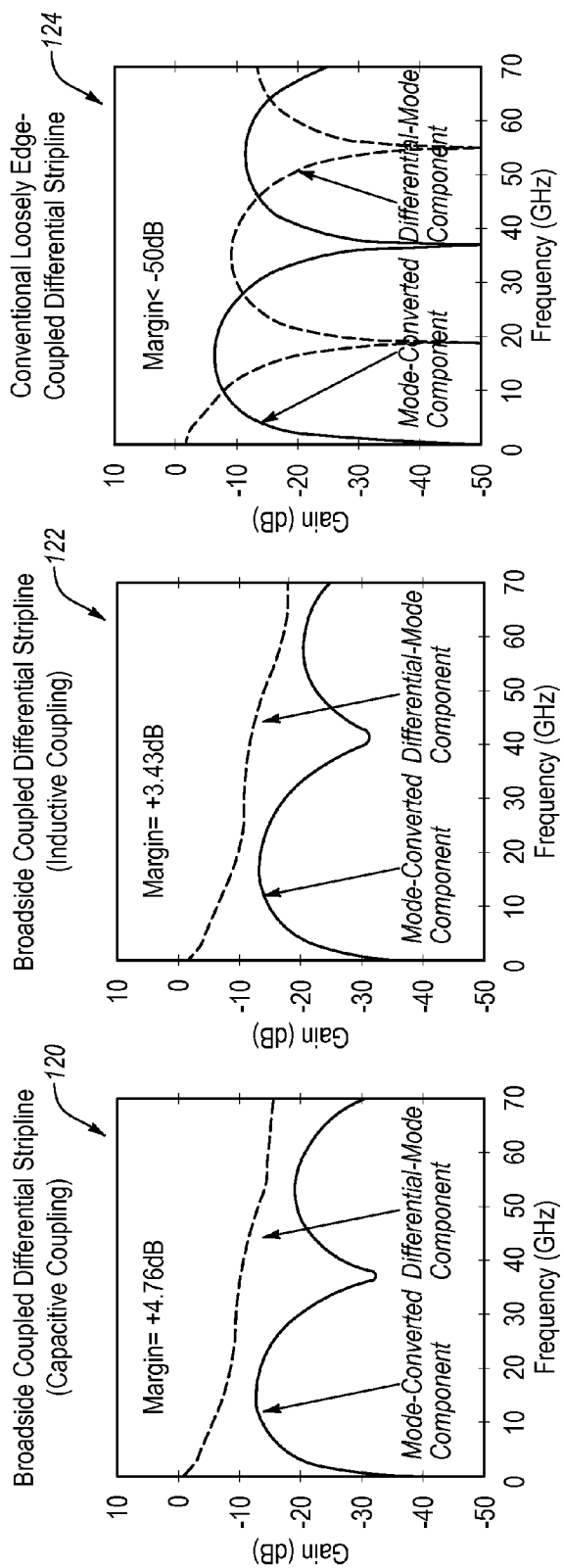

COMPENSATING FOR INTRA-PAIR SKEW IN DIFFERENTIAL SIGNALING

FIELD

The embodiments discussed herein are related to compensating for intra-pair skew in differential signaling.

BACKGROUND

A differential signal typically includes two separate signals that are sent along two different signal paths. Information is read from and written to a differential signal based on comparisons between the two separate signals. The two different signal paths traversed by the two signals in a differential signal may be separate traces on or in a circuit board. The two signals in a differential signal, however, may not propagate at the same speed due to non-uniformities in the materials surrounding the traces, which may cause intra-pair skew between the two signals of the differential signal. Intra-pair skew may result in degradation and/or loss of a differential signal.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a circuit may be configured to reduce electrical signal degradation. The circuit may include a first ground plane and a second ground plane. The circuit may also include a first trace disposed between the first ground plane and the second ground plane. The first trace may be configured to carry a first signal of a differential signal. The circuit may also include a second trace disposed between the first trace and the second ground plane. The second trace may be substantially parallel to the first trace and may have at least a portion thereof substantially aligned with the first trace. The second trace may also be configured to carry a second signal of the differential signal. The circuit may also include a first dielectric material disposed between the first trace and the second trace that has a first dielectric value. Further, the circuit may include a second dielectric material disposed between the first trace and the first ground plane and disposed between the second trace and the second ground plane. The second dielectric material may have a second dielectric value different from the first dielectric value. A difference between the first dielectric value and the second dielectric value may be large enough to suppress a mode conversion of the differential signal from a differential mode to a common mode.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which:

FIG. 1B illustrates a plot of an example mixed-mode pulse response of a common-mode pulse, a differential-mode pulse, and a mode-conversion pulse with respect to relatively weak capacitive coupling;

FIG. 1C, illustrates a plot of an example mixed-mode pulse response of a common-mode pulse, a differential-mode pulse, and a mode-conversion pulse with respect to relatively strong capacitive coupling;

FIG. 1D illustrates a plot of an example mixed-mode pulse response of a common-mode pulse, a differential-mode pulse, and a mode-conversion pulse with respect to relatively weak inductive coupling;

FIG. 1E illustrates a plot of an example frequency response of a broadside coupled differential stripline that is capacitively coupled;

FIG. 1F illustrates a plot of an example frequency response of a broadside coupled differential stripline that is inductively coupled;

FIG. 1G illustrates a plot of an example frequency response of a conventional loosely edge-coupled differential stripline in which the two traces for the signals of a differential signal run next to each other on the same layer;

DESCRIPTION OF EMBODIMENTS

As explained in detail below, a circuit may be configured to compensate for intra-pair skew that may be experienced by a differential signal. Intra-pair skew may be caused by the two signals of a differential signal propagating at different speeds. The intra-pair skew may result in signal degradation of the differential signal. For example, when two signals of a differential signal propagate at significantly different speeds, they may become out of phase with each other such that the differential signal may change modes, e.g., changing from a differential mode to a common mode. The change from a differential mode to a common mode may result in loss of the information carried by the differential signal. Mode conversion caused by intra-pair skew typically increases as the frequencies of differential signals are increased. Accordingly, intra-pair skew may limit maximum data rates that may be obtained for differential signals.

According to some embodiments described herein, a circuit configured to compensate for intra-pair skew may include a first trace configured to carry a first signal of a differential signal. The circuit may also include a second trace configured to carry a second signal of the differential signal. The first trace may be disposed between a first ground plane of the circuit and the second trace and the second trace may be disposed between the first trace and a second ground plane of the circuit. Accordingly, the first and second signals may be disposed on different layers of the circuit. Additionally, the first and second traces may be substantially parallel to each other and may have at least a portion thereof substantially aligned with each other such that the first trace and the second trace may be broadside coupled.

The circuit may further include a first dielectric material having a first dielectric value and a second dielectric material having a second dielectric value different from the first dielectric value. The first dielectric material may be disposed between the first trace and the second trace and the second dielectric material may be disposed between the first trace and the first ground plane as well as between the second trace and the second ground plane. The first and second dielectric values may be configured such that the difference between them may compensate for intra-pair skew between the first and second signals, which may suppress a mode conversion of the differential signal to maintain a differential mode of the differential signal. The mode-conversion suppression may be maintained over wide frequency ranges of the differential signal such that the data rate of the differential signal may be increased for the circuit as compared to other circuits that do not incorporate the teachings described herein.

Embodiments of the present disclosure will be explained with reference to the accompanying drawings.

Figure 1A:
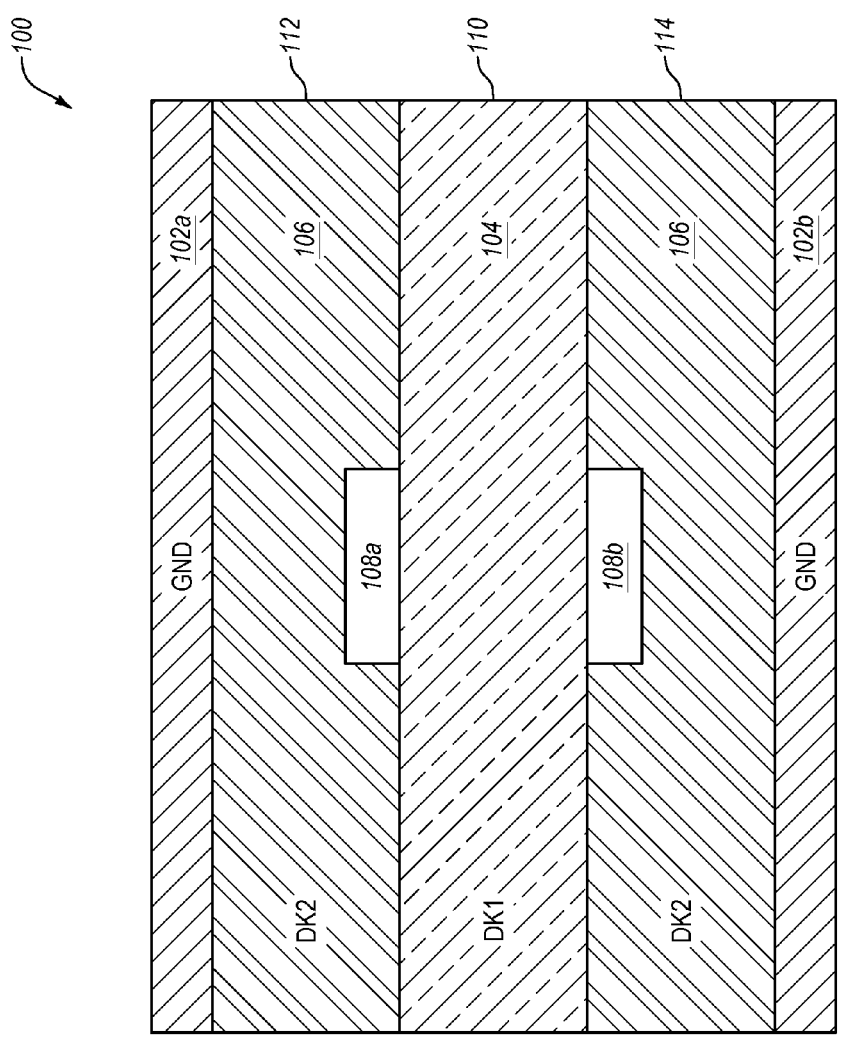
FIG. 1A illustrates a cross section of an example circuit configured to compensate for intra-pair skew that may be experienced by a differential signal.

FIG. 1A illustrates a cross section of an example circuit 100 configured to compensate for intra-pair skew that may be experienced by a differential signal, according to at least one embodiment disclosed herein. The circuit 100 may be a layered circuit such as a Printed Circuit Board (PCB) or an Integrated Circuit (IC) or an IC Package that may include more than one layer.

In the illustrated embodiment, the circuit 100 may include a first ground plane 102a and a second ground plane 102b, which may each be associated with different layers of the circuit 100 such as illustrated in FIG. 1A. The ground planes 102a and 102b are labeled as "GND" in FIG. 1A and may include any suitable type of conductor that may cover a substantial portion of their respective layers such that current may pass through the ground planes 102a and 102b.

The circuit 100 may also include a first trace 108a and a second trace 108b disposed between the first ground plane 102a and the second ground plane 102b. The first trace 108a and the second trace 108b may include any suitable type of conductor configured to carry an electrical current. The first trace 108a and the second trace 108b may be configured as a differential pair such that the first trace 108a may be configured to carry a first signal of a differential signal and the second trace 108b may be configured to carry a second signal of the differential signal.

The first trace 108a and the second trace 108b may be broadside coupled. For example, the first trace 108a may be disposed at a layer of the circuit 100 and the second trace 108b may be disposed at another layer of the circuit 100 in a manner such that at least a portion of the second trace 108b is underneath the first trace 108a and runs substantially parallel to the first trace 108a.

The circuit 100 may also include a first dielectric material 104 and a second dielectric material 106. The first dielectric material 104 may be disposed between the first trace 108a and the second trace 108b in a manner such as that illustrated in FIG. 1A to form a first dielectric layer 110 of the circuit 100. The second dielectric material 106 may be disposed between the first dielectric material 104 and the first ground plane 102a as illustrated in FIG. 1A to form a second dielectric layer 112. The second dielectric material 106 may also be disposed between the first dielectric material 104 and the second ground plane 102b as illustrated in FIG. 1A to form a third dielectric layer 114.

The first dielectric material 104 may have a first dielectric constant ("Dk1") and the second dielectric material 106 may have a second dielectric constant ("Dk2"). The first dielectric material 104 and the second dielectric material 106 may be configured such that the first dielectric constant and the second dielectric constant differ from each other in a manner that compensates for intra-pair skew and suppresses a mode conversion of differential signals that may propagate along the first trace 108a and the second trace 108b.

In some embodiments, the first dielectric constant may be configured to be greater than the second dielectric constant, which may create a capacitive coupling between the first trace 108a and the second trace 108b. In other embodiments, the first dielectric constant may be configured to be less than the second dielectric constant, which may create an inductive coupling between the first trace 108a and the second trace 108b. The capacitive or inductive coupling may cause the differential-mode components of a differential signal to have a higher gain than the common-mode components converted from the differential signal over a wide frequency range. A mode-conversion may become a problem when the gain of the common-mode components converted from the differential signal is greater than the gain of the differential-mode components of the differential signal. Accordingly, the inductive or capacitive coupling may suppress the problem of the mode-conversion over a large frequency range by maintaining a higher gain for the differential-mode components of the differential signal than the common-mode components converted from the differential signal over the large frequency range.

The first dielectric material 104 and the second dielectric material 106 may be configured such that the difference between the first dielectric constant and the second dielectric constant provides enough capacitive or inductive coupling between the first trace 108a and the second trace 108b to suppress mode conversion of the differential signal while also avoiding large cross-talk within the circuit 100 that may be caused by too great of a difference between the first dielectric constant and the second dielectric constant. In some embodiments, the first dielectric constant and the second dielectric constant may be determined based off of an expression that may represent the reduction of the effect of intra-pair skew in differential signals that may propagate along the first trace 108a and the second trace 108b. The reduction of the effect of intra-pair skew may be referred to as a "Skew Reduction Factor" ("SRF") and may be represented by the following expression:

$$SRF=(Dk1-Dk2)/\Delta Dk.$$

In the above-expression "SRF" may represent the Skew Reduction Factor, "Dk1" may represent the first dielectric constant, "Dk2" may represent the second dielectric constant. Additionally, in the above expression, "$\Delta Dk$" may represent a worst deviation in Dk2 or a combination of a worst deviation in Dk1 and Dk2, which may be a factor of the first dielectric material 104 and the second dielectric material 106 not being homogenous materials.

For example, with the first dielectric material 104 and the second dielectric material 106 not being homogenous, the second dielectric constant of the second dielectric layer 112 as it relates to the first dielectric constant may be different than the second dielectric constant of the third dielectric layer 114 as it relates to the first dielectric constant. When the first dielectric material 104 is a single-ply material, the first dielectric material 104 may be modeled as being homogenous (even though it may not be) because the first dielectric material 104 and the first dielectric constant may be substantially the same from the perspective of the first trace 108a and the second trace 108b. Therefore, "$\Delta Dk$" may represent a worst deviation in the second dielectric constant between the second dielectric layer 112 and the third dielectric layer 114.

When the first dielectric material 104 is a multi-ply material, the first dielectric material 104 and associated first dielectric constant may be different from the perspectives of the first trace 108a and the second trace 108b. Therefore, "ΔDk" may represent a worst deviation in the first dielectric constant between the different plys of the first dielectric material 104 as well as a deviation in the second dielectric constant of the second dielectric material 106 of the second dielectric layer 112 and the third dielectric layer 114.

For capacitive coupling, the first dielectric material 104 and the second dielectric material 106 may be configured such that the first dielectric constant, the second dielectric constant, and the worst deviation "ΔDk" result in a skew reduction factor that is approximately between "1" and "6," which may provide a sufficient amount of coupling for skew reduction while also avoiding excess cross-talk. For inductive coupling, the first dielectric material 104 and the second dielectric material 106 may be configured such that the first dielectric constant, the second dielectric constant, and the worst deviation "ΔDk" result in a skew reduction factor that is approximately between "−1" and "−6," which may provide a sufficient amount of coupling for skew reduction while also avoiding excess cross-talk.

In some embodiments, the amount of coupling used for inductive coupling may be less than the amount of coupling used for capacitive coupling to achieve a desired skew-effect reduction while avoiding pre-cursor ISI (inter-symbol interference). The amount of inductive coupling may be lower because inductive coupling may not cause pre-cursor ISI even when the inductive coupling is relatively weak. In contrast, capacitive coupling may cause a significant amount of pre-cursor ISI when the amount of capacitive coupling is relatively weak. Pre-cursor ISI may not be desired because a conventional equalizer may not be able to compensate for a significant amount of pre-cursor ISI.

A significant amount of pre-cursor ISI may occur with relatively weak capacitive coupling and not relatively weak inductive coupling because with inductive coupling a differential-mode pulse propagates faster than a common-mode pulse; whereas, with capacitive coupling a differential-mode pulse propagates slower than a common-mode pulse. If the amount of coupling (either capacitive or inductive) is substantially weak, a separation between the common-mode pulses and the differential-mode pulses may be reduced such that a magnitude of a mode-conversion pulse may increase. In capacitive coupling, the mode-conversion pulse may arrive earlier than the differential-mode pulse and the increased magnitude of the mode-conversion pulse when the capacitive coupling is weak may cause a significant amount of pre-cursor ISI in the corresponding differential-mode pulse. In contrast, in inductive coupling, the mode-conversion pulse may arrive after the differential-mode pulse such that even if the inductive coupling is weak, the mode-conversion pulse may not cause a significant amount of pre-cursor ISI in the corresponding differential-mode pulse. Therefore, inductive coupling may allow for less cross-talk (e.g., as caused by pre-cursor ISI) than capacitive coupling in some instances.

By way of example, FIG. 1B illustrates a plot 105 of an example mixed-mode pulse response of a common-mode pulse 107, a differential-mode pulse 109, and a mode-conversion pulse 111 with respect to relatively weak capacitive coupling; FIG. 1C, illustrates a plot 115 of an example mixed-mode pulse response of a common-mode pulse 116, a differential-mode pulse 117, and a mode-conversion pulse 118 with respect to relatively strong capacitive coupling; and FIG. 1D illustrates a plot 121 of an example mixed-mode pulse response of a common-mode pulse 125, a differential-mode pulse 123, and a mode-conversion pulse 127 with respect to relatively weak inductive coupling.

As illustrated in an area 113 of the plot 105 of FIG. 1B, the mode-conversion pulse 111 in the area 113 may be relatively strong because the weak capacitive coupling may not provide a large degree of separation between the common-mode pulse 107 and the differential-mode pulse 109. The mode-conversion pulse 111 in the area 113 may be sufficiently strong that it may be converted back to the differential-mode pulse 109 and may accordingly cause a premature rise in the differential-mode pulse 109, which may indicate a significant amount of pre-cursor ISI.

In contrast, as illustrated in FIG. 1C, the capacitive coupling may be strong enough that the common-mode pulse 116 and the differential-mode pulse 117 may be sufficiently separated such that the mode-conversion pulse 118 in an area 119 may be relatively weak. The mode-conversion pulse 118 in the area 119 may be weak enough that it may not be converted back to the differential-mode pulse 117 and may not cause a significant premature rise in the differential-mode pulse 117, which may indicate little to no pre-cursor ISI.

Additionally, as illustrated in FIG. 1D, in relatively weak inductive coupling, the differential-mode pulse 123 may arrive sooner than the common-mode pulse 125 and may arrive sooner than or on the same time, at the latest, as the mode-conversion pulse 127. Therefore, although the separation between the differential-mode pulse 123 and the common-mode pulse 125 is relatively small, the mode-conversion pulse 127 is relatively strong, and the mode-conversion pulse 127 may be converted back to the differential-mode pulse 123, the mode-conversion pulse 127 may not cause a premature rise in the differential-mode pulse 123, as indicated in the area 129, which may indicate little to no pre-cursor ISI. As such, even with relatively weak inductive coupling, a significant amount of pre-cursor ISI may not be present.

FIG. 1E illustrates a plot 120 of an example frequency response of a broadside coupled differential stripline (e.g., the traces 108a and 108b of FIG. 1A) that is capacitively coupled, according to at least one embodiment described herein. FIG. 1F illustrates a plot 122 of an example frequency response of a broadside coupled differential stripline (e.g., the traces 108a and 108b of FIG. 1A) that is inductively coupled, according to at least one embodiment described herein. FIG. 1G illustrates a plot 124 of an example frequency response of a conventional loosely edge-coupled differential stripline in which the two traces for the signals of a differential signal run next to each other on the same layer.

In the illustrated example of FIG. 1E, the first dielectric constant may be equal to 3.42, the second dielectric constant may be equal to 3.22, and the deviation of the second dielectric constant "ΔDk2" (ignoring any deviation in the first dielectric constant) may be equal to 0.05. Based on these example values, the Skew Reduction Factor may be equal to 4. As illustrated by the plot 120, with the Skew Reduction Factor equal to 4, the gain of the differential-mode components of a differential signal propagating through the differential stripline (e.g., the traces 108a and 108b of FIG. 1A) with capacitive coupling may be greater than the gain of the mode-converted components by at least 4.76 dB (as indicated by "Margin=4.76 dB" in the plot 120)

over a frequency range from 0 Hz to 70 GHz. Accordingly, over the frequency range from 0 Hz to 70 GHz, the differential mode of the differential signal may be maintained with the capacitive coupling.

Similarly, in the illustrated example of FIG. 1F, the first dielectric constant may be equal to 3.22, the second dielectric constant may be equal to 3.42, and the deviation of the second dielectric constant "ΔDk2" (ignoring any deviation in the first dielectric constant) may be equal to 0.05. Based on these example values, the Skew Reduction Factor may be equal to −4. As illustrated by the plot 122, with the Skew Reduction Factor equal to −4, the gain of the differential-mode components of a differential signal propagating through the differential stripline (e.g., the traces 108a and 108b of FIG. 1A) with inductive coupling may be greater than the gain of the mode-converted components by at least 3.43 dB (as indicated by "Margin=3.43 dB" in the plot 122) over a frequency range from 0 Hz to 70 GHz. Accordingly, over the frequency range from 0 Hz to 70 GHz, the differential mode of the differential signal may be maintained with the inductive coupling.

In contrast, as illustrated in the plot 124 of FIG. 1G, the gain of the differential-mode components in a conventional loosely edge-coupled differential stripline may be less than the gain of the mode-converted components at certain frequencies over a 70 GHz frequency range by a factor greater than 50 dB (as indicated by "Margin<−50 dB" in the plot 124). Additionally, in the illustrated embodiment, the gain of the differential-mode components in a conventional loosely edge-coupled differential stripline may be maintained over the frequency range from 0 Hz only to approximately 19 GHz.

The capacitive or inductive coupling of differential striplines may be achieved by selecting certain materials with certain properties to achieve the desired first dielectric constant for the first dielectric material 104 and to achieve the desired second dielectric constant for the second dielectric material 106. For example, the first and second dielectric constants and their deviations may be based on whether their respective dielectric materials are made from a prepeg material or a core material. Both the prepeg material and the core material may be a fiberglass material that is impregnated with a type of resin. The core material may be hardened before a conductor pattern (e.g. a signal trace) may be made on a surface of the core material. The prepreg material may be hardened after being laminated with the core material that is already hardened and has the conductor pattern on its surface. When the same fiberglass and resin are used for the core and prepeg materials, the dielectric value for the core material may generally be higher than that for prepeg materials due to the core materials typically having a higher concentration of fiberglass than the prepeg materials.

The type of glass or resin used in the core or prepeg may also affect the dielectric values. For example, the glass used in the fiberglass may be E-glass (alumino-borosilicate glass with less than 1% w/w alkali oxides) or NE-glass, which may have different dielectric properties. Similarly, the resin type may affect the dielectric values of the first dielectric material 104 and the second dielectric material 106. For example, the resin type may be a Megtron 6, an FX2, or an FL700 resin type, which may have different dielectric properties.

Additionally, the percentage of resin in the first dielectric material 104 or the second dielectric material 106 may affect the first or second dielectric constants, respectively. For example, a dielectric material with a resin percentage of 57% may have a higher dielectric constant than a dielectric material with a resin percentage of 77% assuming that the other properties (e.g., glass type, resin type, fiberglass style, etc.) are the same and the dielectric constant of the resin is lower than the dielectric constant of the fiberglass.

Further, the style of glass cloth used for the fiberglass may also affect the dielectric constant of a particular dielectric material. For example, different glass cloths may have different weave patterns, which may affect the dielectric properties. Similarly, the number of plys of the glass cloth may also affect the dielectric properties of the first dielectric material 104 or the second dielectric material 106. For example, the deviation of the second dielectric constant of the second dielectric material 106 may be reduced by using a multiple-ply (e.g., 2 ply) glass cloth as compared to a single-ply glass cloth because the dielectric effects of the multiple plys may be averaged such that the deviation between the second dielectric constant of the second dielectric material 106 of the second dielectric layer 112 and the third dielectric layer 114 may be reduced. Conversely, as mentioned above, the variation of the first dielectric constant of the first dielectric material 104 may become non-negligible when a glass cloth of more than one ply is used for the first dielectric material 104.

In some embodiments, the first dielectric material 104 may be a core material and the second dielectric material 106 may be a prepeg material, which may result in a PCP (Prepeg-Core-Prepeg) stack configuration of the circuit 100. In other embodiments, the first dielectric material 104 may be a prepeg material and the second dielectric material 106 may be a core material, which may result in a CPC (Core-Prepeg-Core) stack configuration of the circuit 100.

Figure 2:
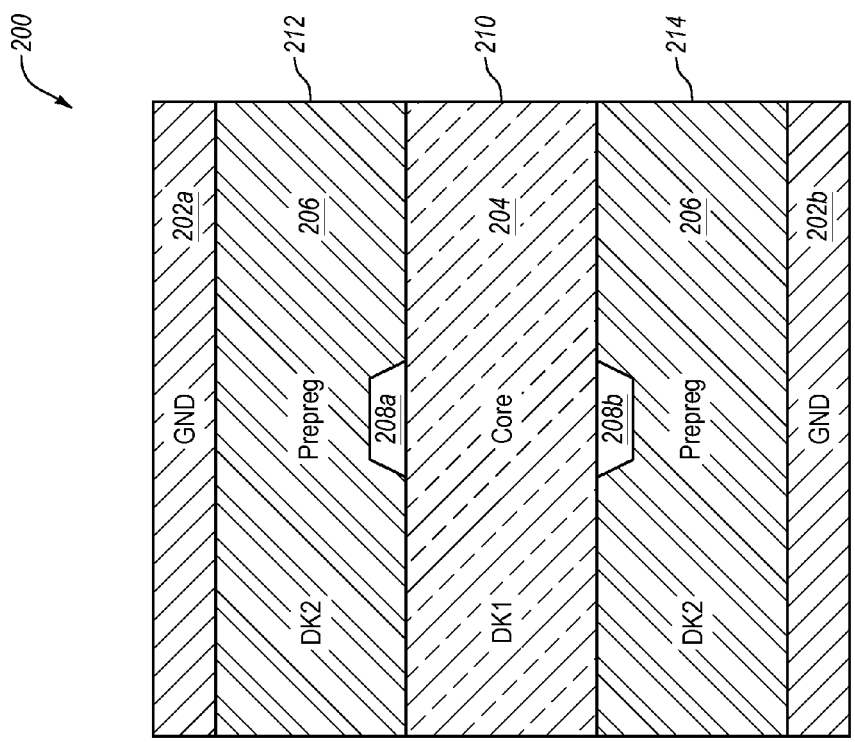
FIG. 2 illustrates an example embodiment of a circuit with a PCP stack configuration.

FIG. 2 illustrates an example embodiment of a circuit 200 with a PCP stack configuration, according to at least one embodiment described herein. The circuit 200 may include a first ground plane 202a, a second ground plane 202b, a first dielectric material 204 forming a first dielectric layer 210, a second dielectric material 206 forming a second dielectric layer 212 and a third dielectric layer 214, a first trace 208a, and a second trace 208b that may be analogous to the first ground plane 102a, the second ground plane 102b, the first dielectric material 104, the first dielectric layer 110, the second dielectric material 106, the second dielectric layer 112, the third dielectric layer 114, the first trace 108a, and the second trace 108b, respectively, of FIG. 1A. As illustrated, in FIG. 2, the first dielectric material 204 may include a core material and the second dielectric material 206 may include a prepeg material such that the circuit 200 may have a PCP stack configuration.

Figure 3:
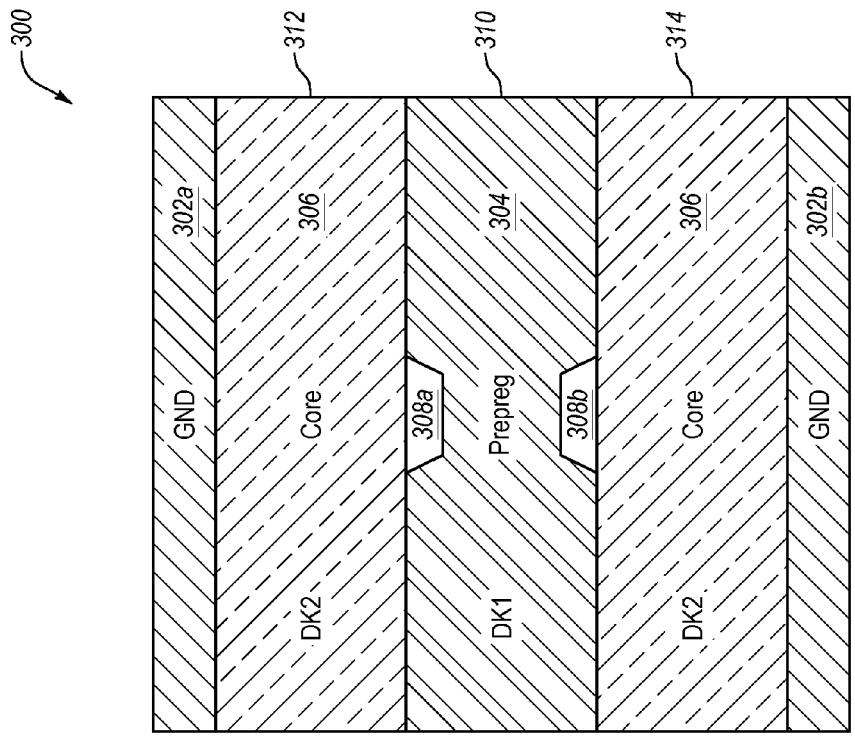
FIG. 3 illustrates an example embodiment of a circuit with a CPC stack configuration.

FIG. 3 illustrates an example embodiment of a circuit 300 with a CPC stack configuration, according to at least one embodiment described herein. The circuit 300 may include a first ground plane 302a, a second ground plane 302b, a first dielectric material 304 forming a first dielectric layer 310, a second dielectric material 306 forming a second dielectric layer 312 and a third dielectric layer 314, a first trace 308a, and a second trace 308b that may be analogous to the first ground plane 102a, the second ground plane 102b, the first dielectric material 104, the first dielectric layer 110, the second dielectric material 106, the second dielectric layer 112, the third dielectric layer 114, the first trace 108a, and the second trace 108b, respectively, of FIG. 1A. As illustrated, in FIG. 3, the first dielectric material 304 may include a prepeg material and the second dielectric material 306 may include a core material such that the circuit 300 may have a CPC stack configuration.

In some instances, the PCP stack configuration of the circuit 200 may allow for increased impedance control over the CPC stack configuration of the circuit 300. For example, the alignment of the traces may affect the impedance of and between the traces. The traces 208a and 208b may be etched on the same core material (e.g., the first dielectric material 204 of the first dielectric layer 210) in the PCP stack configuration of the circuit 200 such that alignment of the traces 208a and 208b may be fairly precise. In contrast, the traces 308a and 308b in the CPC stack configuration may be etched on different core materials (e.g., the second dielectric material 306 of the second dielectric layer 312 and the second dielectric material 306 of the third dielectric layer 314) that may be laminated to the first dielectric layer 310, which may introduce an increased chance that the traces 308a and 308b are not aligned as desired.

Additionally, the impedance of and between traces may be affected by the distance between the traces. In the PCP stack configuration of the circuit 200, the traces 208a and 208b may be separated by a core material, which may be relatively stiff such that the distance between the traces 208a and 208b may be relatively uniform. In contrast, in the CPC stack configuration of the circuit 300, the traces 308a and 308b may be separated by a prepeg material that may be softer than the core material such that the distance between the traces 308a and 308b may be less uniform. Therefore, the impedance between the traces 308a and 308b of the CPC stack configuration may have more variations than the impedance between the traces 208a and 208b of PCP stack configuration.

Further, the impedance of and between traces may be affected by the width of the traces. With a constraint to obtain a target impedance, trace width may be a function of the thickness of the dielectric material between the traces such that a thicker dielectric material may allow for wider traces. In the PCP stack configuration of the circuit 200, the thickness of the first dielectric layer 210 between the traces 208a and 208b may be greater than the thickness of the first dielectric layer 310 between the traces 308a and 308b in the CPC stack configuration of the circuit 300 because the thickness of the traces 208a and 208b may not be subtracted from the thickness of the first dielectric layer 210 in the PCP stack, whereas the thickness of the traces 308a and 308b may be subtracted from the thickness of the first dielectric layer 310 in the CPC stack. Therefore, in the PCP stack configuration of the circuit 200, the traces 208a and 208b, to achieve a desired impedance, may be wider than the traces 308a and 308b in the CPC stack configuration of the circuit 300. Consequently, a desired impedance of the traces 308a and 308b of the CPC stack configuration may be harder to obtain than a desired impedance of the traces 208a and 208b of the PCP stack configuration because the CPC stack configuration may not allow for as wide of traces as the PCP configuration due to the reduced thickness of the first dielectric layer 310 as compared to the first dielectric layer 210.

The PCP stacking configuration of the circuit 200 may generally be used for capacitive coupling because, as mentioned earlier, core material may have a higher dielectric value than prepeg material that uses the same resin and capacitive coupling may be obtained by having the first dielectric constant greater than the second dielectric constant. However, the PCP stacking configuration of the circuit 200 may limit the ability to achieve inductive coupling without using different resins because of the increased dielectric constant of core material as compared to prepeg material.

Similarly, the CPC stacking configuration of the circuit 300 may be used generally for inductive coupling because of the generally higher dielectric constant of core material than prepeg material. However, in some instances the CPC stacking configuration of the circuit 300 may also be used for capacitive coupling while using the same resin for the core material and the prepeg material even though core material generally has a higher dielectric constant than prepeg. In some instances, core material may be configured to have a lower dielectric constant than prepeg material, but the difference may be relatively small. However, as mentioned above, in some instances a desired amount of skew-effect reduction may be achieved with less inductive coupling than capacitive coupling, while avoiding pre-cursor ISI. As such, the difference between the first dielectric constant and the second dielectric constant may be smaller for inductive coupling than capacitive coupling. Therefore, a CPC stack configuration where the core material may be configured to have a higher dielectric constant than prepeg material may be used for inductive coupling where the same core material and prepeg material may not produce a PCP stack configuration that work for sufficient capacitive coupling.

Table 1 below illustrates properties of a circuit with inductive coupling that may be obtained using the properties described above.

TABLE 1

| | | First Dielectric Material | | | Second Dielectric Material | | | | | |
|---|---|---|---|---|---|---|---|---|---|---|
| Stack | Material | Cloth | Resin Content | Dk1 (1 GHz) | Material | Cloth | Resin Content | Dk2 (1 GHz) | Dk1 − Dk2 | ΔDk | SRF |
| CPC | Megtron6/ NE Prepreg | #1078 | 77% | 3.13 | Megtron6/ E Core | #1078 | 57% | 3.65 | −0.52 | 0.11 | −4.73 |

Table 2 below illustrates properties of a circuit with capacitive coupling that may be obtained using the properties described above.

TABLE 2

| | | First Dielectric Material | | | Second Dielectric Material | | | | | |
|---|---|---|---|---|---|---|---|---|---|---|
| Stack | Material | Cloth | Resin Content | Dk1 (1 GHz) | Material | Cloth | Resin Content | Dk2 (1 GHz) | Dk1 − Dk2 | ΔDk | SRF |
| PCP | Megtron6/ E Core | #2116 | 54% | 3.71 | Megtron6/ NE Prepeg | #1035 | 77% | 3.13 | +0.58 | 0.11 | +5.27 |

Accordingly, as described above, the circuits 100, 200, and 300 may be configured to produce inductive or capacitive coupling between broadside coupled differential striplines in a manner that may compensate for intra-pair skew and maintain the differential mode of a differential signal over a wide frequency range. Modifications, additions, or omissions may be made to FIGS. 1A-1G, 2, and 3 without departing from the scope of the present disclosure. For example, the dielectric constants and materials described are for exemplary purposes and are not limiting.

Figure 4:
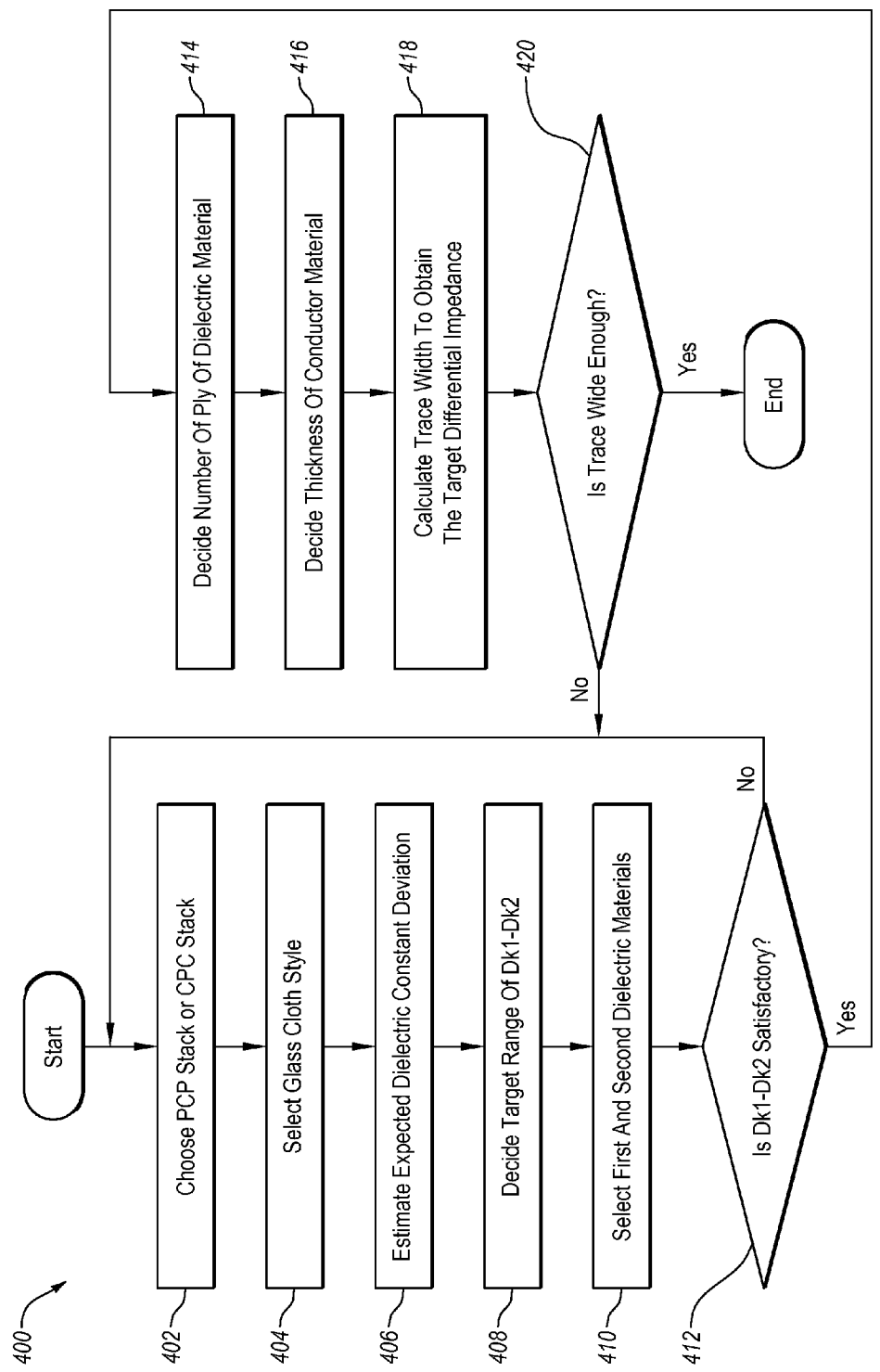
FIG. 4 is a flowchart of an example method of modeling a circuit configured to reduce electrical signal degradation.

FIG. 4 is a flowchart of an example method 400 of modeling a circuit configured to reduce electrical signal degradation, arranged in accordance with at least one embodiment described herein. The method 400 may be implemented, in some embodiments, using any applicable design software stored on a computer-readable storage medium according to the principles described above with respect to the circuits 100, 200, and 300 of FIGS. 1A, 2, and 3, respectively. Although illustrated as discrete blocks, various blocks may be divided into additional blocks, combined into fewer blocks, or eliminated, depending on the desired implementation.

Accordingly, the method 400 may be used to model a circuit that includes a first dielectric material forming a first dielectric layer such as the first dielectric materials 104, 204 and/or 304 forming the first dielectric layers 110, 210, and 310, respectively, described above with respect to FIGS. 1A, 2, and 3. The modeled circuit may also include a second dielectric material forming a second dielectric layer and a third dielectric layer such as described above with respect to the second dielectric materials 106, 206, and/or 306, the second dielectric layers 112, 212, and/or 312, and the third dielectric layers 114, 214, and/or 314 of FIGS. 1A, 2, and 3. Further, the modeled circuit may include first and second traces configured such as the first and second traces 108*a* and 108*b*, 208*a* and 208*b*, and 308*a* and 308*b* described above with respect to FIGS. 1A, 2, and 3.

The first and second traces may be configured as a differential broadside coupled stripline and the method 400 may be used to configure the first and second dielectric materials such that the first and second traces may be a capacitively or inductively coupled differential broadside-coupled stripline in a manner that may compensate for intra-pair skew. Although illustrated as discrete blocks, various blocks may be divided into additional blocks, combined into fewer blocks, or eliminated, depending on the desired implementation.

The method 400 may begin at block 402 where a PCP stack configuration or a CPC stack configuration may be chosen for a layered circuit. The selection of the PCP stack configuration or CPC stack configuration may be based on any number of factors such as whether capacitive or inductive coupling is desired for the differential broadside-coupled stripline and the amount of coupling and impedance control desired.

At block 404, a style of glass cloth may be selected for the fiberglass of the first dielectric material of the layered circuit and for the fiberglass of the second dielectric material of the layered circuit. In some embodiments, the style of glass cloth may be the same for the first dielectric material and the second dielectric material or the style of glass cloth may be different. At block 406, an expected dielectric constant deviation (e.g., "$\Delta Dk$" described above) may be determined based on the selected glass cloth style.

At block 408, a target range of a difference between a first dielectric constant ("Dk1") of the first dielectric material and a second dielectric constant ("Dk2") of the second dielectric material may be determined. For example, a target range of "Dk1-Dk2" that may be associated with capacitive or inductive coupling may be determined at block 408.

At block 410, the first dielectric material and the second dielectric material may be selected. The first and second dielectric materials may be chosen based on the target range of "Dk1-Dk2" and/or the glass cloth style selected. For example, the first dielectric material and the second dielectric material may be selected based on dielectric properties that may allow for the target range of "Dk1-Dk2" determined at block 408.

At block 412, after selecting the materials it may be determined whether the selected materials for the first dielectric material and the second dielectric material yield a value of "Dk1-Dk2" that is within the target range of "Dk1-Dk2." When the value of "Dk1-Dk2" is not within the target range, the method 400 may return to block 402. When the value of "Dk1-Dk2" is within the target range, the method 400 may proceed to block 414.

At block 414, a ply number for the glass cloth of the materials for the first dielectric material and the second dielectric material may be determined. As mentioned above, in some instances the ply number selected for the first dielectric material may be one and the ply number for the second dielectric material may be more than one to reduce the deviation in dielectric constant ("$\Delta Dk$").

At block 416, a thickness of conductor material that may be used for the first and second traces may be determined. The thickness may be selected based on a desired differential impedance between the first and second traces. At block 418, a width may be determined for the first and second traces to obtain the desired differential impedance between the first and second traces. At block 420, it may be determined whether the first and second traces are wide enough to obtain the desired differential impedance. When the traces are wide enough, the method 400 may end. When the traces are not wide enough, the method 400 may repeat.

Modeling a circuit according to the method 400 may be used to produce a circuit that may at least partially compensate for intra-pair skew of a differential signal of the circuit. Modifications may be made to the method 400 without departing from the scope of the present disclosure. For example, the order of the steps associated with the blocks may be performed in a different order than that presented.

The method 400 described herein may be implemented using computer-readable media for carrying or having computer-executable instructions or data structures stored thereon. Such computer-readable media may be any available media that may be accessed by a general-purpose or special-purpose computer (e.g., a processor). By way of example, and not limitation, such computer-readable media may include a non-transitory or tangible computer-readable storage media including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, or any other storage medium which may be used to carry or store desired program code in the form of computer-executable instructions or data structures and which may be accessed by a general-purpose or special-purpose computer. Combinations of the above may also be included within the scope of computer-readable media.

Computer-executable instructions include, for example, instructions and data which cause a general-purpose computer, special-purpose computer, or special-purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

Figure 5:
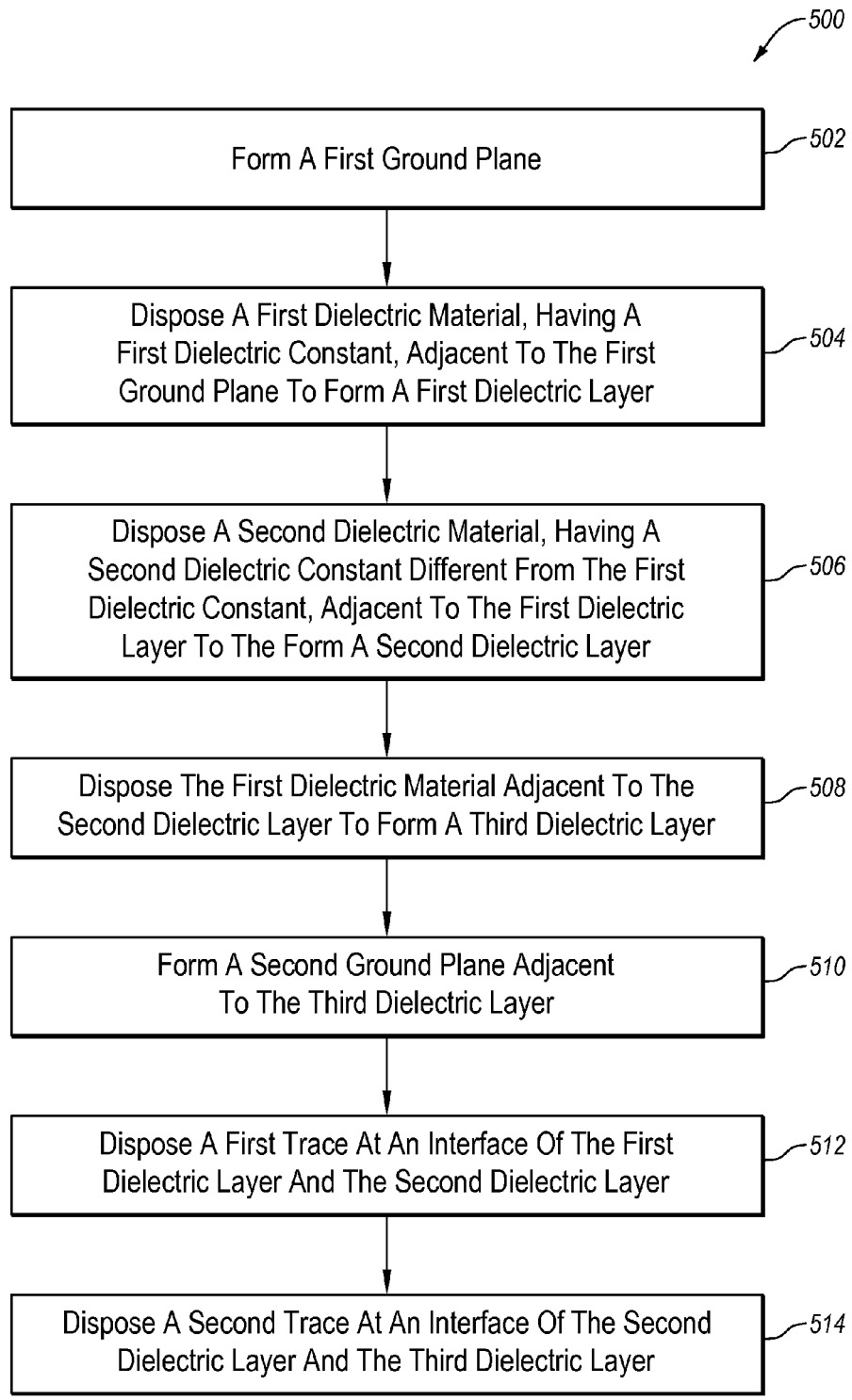
FIG. 5 is a flowchart of an example method of forming a circuit configured to reduce electrical signal degradation.

FIG. 5 is a flowchart of an example method 500 of forming a circuit configured to reduce electrical signal degradation, arranged in accordance with at least one embodiment described herein. The method 500 may be implemented, in some embodiments, by forming or manufacturing a layered circuit according to the principles described above with respect to the circuits 100, 200, and 300 of FIGS. 1A, 2, and 3, respectively. Although illustrated as discrete blocks, various blocks may be divided into additional blocks, combined into fewer blocks, or eliminated, depending on the desired implementation.

The method 500 may begin at block 502 where a first ground plane may be formed. For example, the second ground plane 102b of FIG. 1A may be formed at block 502. At block 504 a first dielectric material may be disposed adjacent to (e.g., in direct contact with) the first ground plane to form a first dielectric layer having a first dielectric constant. For example, with respect to FIG. 1A, the second dielectric material 106 may be disposed adjacent to the second ground plane 102b at block 504 to form the third dielectric layer 114 having the second dielectric constant.

At block 506, a second dielectric material may be disposed adjacent to the first dielectric layer formed at block 504 to form a second dielectric layer having a second dielectric constant different from the first dielectric constant of the first dielectric material disposed at block 504. For example, with respect to FIG. 1A, the first dielectric material 104 may be disposed adjacent to the third dielectric layer 114 at block 506 to form the first dielectric layer 110 having the first dielectric constant.

At block 508, the first dielectric material disposed at block 504 may be disposed adjacent to the second dielectric layer formed at block 506 to form a third dielectric layer. For example, with respect to FIG. 1A, the second dielectric material 106 may be disposed adjacent to the first dielectric layer 110 at block 508 to form the second dielectric layer 112 having the second dielectric constant. At block 510, a second ground plane may be formed adjacent to the third dielectric layer formed at block 508. For example, with respect to FIG. 1A, the first ground plane 102a may be formed adjacent to the second dielectric layer 112 at block 510.

At block 512, a first trace may be disposed at an interface of the first and second dielectric layers formed at blocks 504 and 506. The first trace may be configured to carry a first signal of a differential signal. For example, with respect to FIG. 1A, the second trace 108b may be formed at block 512. At block 514, a second trace may be disposed at an interface of the second and third dielectric layers formed at blocks 506 and 508. The second trace may be substantially parallel to the first trace disposed at block 512 and may have at least a portion thereof substantially aligned with the first trace disposed at block 512. Additionally, the second trace disposed at block 514 may be configured to carry a second signal of the differential signal. For example, with respect to FIG. 1A, the first trace 108a may be disposed at block 514.

A difference between the second dielectric constant of the second dielectric layer formed at block 506 and the first dielectric constant of the first and third dielectric layers formed at blocks 504 and 508 may suppress a mode conversion of the differential signal such that a differential mode of the differential signal is maintained over a wide frequency range. In some embodiments, the first dielectric constant may be greater than the second dielectric constant to form an inductive coupling between the first and second traces. In other embodiments, the first dielectric constant may be less than the second dielectric constant to form a capacitive coupling between the first and second traces. Additionally, in some embodiments, the first and second dielectric constants may be configured such that a Skew Reduction Factor discussed above may be less than negative one and greater than negative six for inductive coupling or greater than one and less than six for capacitive coupling.

Forming a circuit according to the method 500 may be used to produce a circuit with that at least compensates for intra-pair skew of a differential signal of the circuit. Modifications may be made to the method 500 without departing from the scope of the present disclosure. For example, the order of the steps associated with the blocks may be performed in a different order than that presented. Additionally, in some embodiments, the first dielectric material may be a prepeg material and the second dielectric material may be core material. In other embodiments, the first dielectric material may be a core material and the second dielectric material may be a prepeg material.

Further, in some embodiments, the method 500 may include configuring the first dielectric material to have the first dielectric constant based on resin content, type of resin, and/or type of glass material of the first dielectric material. In these or other embodiments, the method 500 may similarly include configuring the second dielectric material to have the second dielectric constant based on resin content, type of resin, and/or type of glass material of the second dielectric material.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present disclosure have been described in detail, it should be understood that the various changes, substitutions, and alterations could be made hereto without departing from the spirit and scope of the invention.

What is claimed is:

1. A circuit configured to reduce electrical signal degradation, the circuit comprising:
   a first ground plane;
   a second ground plane;
   a first trace disposed between the first ground plane and the second ground plane, the first trace having a first width and being configured to carry a first signal of a differential signal;
   a second trace disposed between the first trace and the second ground plane, the second trace being substantially parallel to the first trace and having a second width substantially equal to the first width, the second trace being aligned with the first trace with respect to the first width and the second width, the second trace being configured based on the first trace such that the second trace is configured to carry a second signal of the differential signal;
   a first dielectric material disposed between the first trace and the second trace and having a first dielectric constant, the first dielectric material being a circuit board core material; and only a second dielectric material disposed between the first trace and the first ground plane and only the second dielectric material being disposed between the second trace and the second ground plane, the second dielectric material being disposed around more than 50% of a first perimeter of the first trace and being disposed around more than 50% of a second perimeter of the second trace, the second dielectric material being a circuit board pre-impregnated ("pre-preg") material and having a second dielectric constant different from the first dielectric constant, a difference between the first dielectric constant and the second dielectric constant suppressing a mode conversion of the differential signal from a differential mode to a common mode.

2. The circuit of claim 1, wherein the first dielectric constant is greater than the second dielectric constant such that the first trace and the second trace have a capacitive coupling.

3. The circuit of claim 1, wherein the first dielectric constant is less than the second dielectric constant such that the first trace and the second trace have an inductive coupling.

4. The circuit of claim 1, wherein the first dielectric material includes a first resin type and the second dielectric material includes a second resin type different from the first resin type.

5. The circuit of claim 1, wherein:
the first dielectric constant is represented by "Dk1";
the second dielectric constant is represented by "Dk2";
a dielectric constant worst variance associated with one or more of Dk1 and Dk2 is represented by "ΔDk"; and
the first dielectric constant and the second dielectric constant are based on a desired skew reduction factor ("SRF") represented by the following expression:

$$SRF=(Dk1-Dk2)/\Delta Dk.$$

6. The circuit of claim 5, wherein Dk1 and Dk2 are configured such that the SRF is less than negative one and greater than negative six.

7. The circuit of claim 5 wherein Dk1 and Dk2 are configured such that the SRF is greater than one and less than six.

8. The circuit of claim 5 wherein ΔDk is based on one or more properties of one or more of the first dielectric material and the second dielectric material, the one or more properties including one or more of a style of glass cloth, a ply number of the glass cloth, resin content, and type of glass.

9. The circuit of claim 1, wherein the first dielectric material is configured to have the first dielectric constant and the second dielectric material is configured to have the second dielectric constant based on one or more of resin content, type of resin, and type of glass.

10. A method of forming a circuit, the method comprising:
forming a first ground plane;
disposing a first dielectric material adjacent to the first ground plane to form a first dielectric layer having a first dielectric constant, the first dielectric material being a circuit board pre-impregnated ("pre-preg") material;
disposing a second dielectric material adjacent to the first dielectric layer to form a second dielectric layer having a second dielectric constant different from the first dielectric constant, the second dielectric material being a circuit board core material;
disposing the first dielectric material adjacent to the second dielectric layer to form a third dielectric layer having the first dielectric constant;
forming a second ground plane adjacent to the third dielectric layer;
disposing a first trace at an interface of the first dielectric layer and the second dielectric layer, only the first dielectric material being between the first trace and the first ground plane, the first dielectric material being disposed around more than 50% of a first perimeter of the first trace and the first trace having a first width and being configured to carry a first signal of a differential signal; and
disposing a second trace at an interface of the second dielectric layer and the third dielectric layer, the second trace being substantially parallel to the first trace and having a second width substantially equal to the first width, only the first dielectric material being between the second trace and the second ground plane, the first dielectric material being disposed around more than 50% of a second perimeter of the second trace, the second trace being aligned with the first trace with respect to the first width and the second width, the second trace being configured based on the first trace such that the second trace is configured to carry a second signal of the differential signal, a difference between the first dielectric constant and the second dielectric constant suppressing a mode conversion of the differential signal from a differential mode to a common mode.

11. The method of claim 10, wherein the first dielectric constant is greater than the second dielectric constant such that the first trace and the second trace have an inductive coupling.

12. The method of claim 10, wherein the first dielectric constant is less than the second dielectric constant such that the first trace and the second trace have a capacitive coupling.

13. The method of claim 10, wherein:
the first dielectric constant is represented by "Dk1";
the second dielectric constant is represented by "Dk2";
a dielectric constant worst variance associated with one or more of Dk1 and Dk2 is represented by "ΔDk"; and
the first dielectric constant and the second dielectric constant are based on a desired skew reduction factor ("SRF") represented by the following expression:

$$SRF=(Dk1-Dk2)/\Delta Dk.$$

14. The method of claim 13, wherein Dk1 and Dk2 are configured such that the SRF is less than negative one and greater than negative six or greater than one and less than six.

15. The method of claim 13, wherein ΔDk is based on one or more properties of one or more of the first dielectric material and the second dielectric material, the one or more properties including one or more of a style of glass cloth, a ply number of the glass cloth, resin content, and type of glass.

16. The method of claim 10, further comprising configuring the first dielectric material to have the first dielectric constant and configuring the second dielectric material to have the second dielectric constant based on one or more of resin content, type of resin, and type of glass.

* * * * *